United States Patent
Kishimoto

(10) Patent No.: US 11,061,435 B2
(45) Date of Patent: Jul. 13, 2021

(54) DISPLAY DEVICE

(71) Applicant: Samsung Display Co., Ltd., Yongin-Si (KR)

(72) Inventor: Hirotsugu Kishimoto, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/055,006

(22) Filed: Aug. 3, 2018

(65) Prior Publication Data

US 2019/0196538 A1 Jun. 27, 2019

(30) Foreign Application Priority Data

Dec. 27, 2017 (KR) .................. 10-2017-0181482

(51) Int. Cl.
*H01L 51/52* (2006.01)
*G06F 1/16* (2006.01)
*B32B 27/30* (2006.01)

(52) U.S. Cl.
CPC ........ *G06F 1/1607* (2013.01); *H01L 51/5253* (2013.01); *B32B 27/308* (2013.01); *B32B 2307/418* (2013.01)

(58) Field of Classification Search
CPC ................................................ H01L 51/5253
See application file for complete search history.

(56) References Cited

U.S. PATENT DOCUMENTS

| | | | |
|---|---|---|---|
| 10,310,333 B2 * | 6/2019 | Yasui | G02F 1/133528 |
| 2016/0209552 A1 * | 7/2016 | Satake | B32B 7/12 |
| 2017/0088758 A1 * | 3/2017 | Bzowej | C08G 18/12 |
| 2017/0253769 A1 * | 9/2017 | Cho | G02B 5/3033 |
| 2017/0309867 A1 * | 10/2017 | Mun | H01L 51/5246 |
| 2018/0100088 A1 * | 4/2018 | Ahn | C08L 33/12 |
| 2018/0150105 A1 * | 5/2018 | Hwang | G06F 1/1637 |
| 2018/0157125 A1 * | 6/2018 | Yasui | C09J 7/385 |

FOREIGN PATENT DOCUMENTS

| | | |
|---|---|---|
| KR | 10-2017-0072973 A | 6/2017 |
| KR | 10-2017-0080436 A | 7/2017 |
| KR | 10-2017-0093610 A | 8/2017 |
| KR | 10-1770864 B1 | 8/2017 |
| KR | 10-2017-0103617 A | 9/2017 |

* cited by examiner

*Primary Examiner* — Abul Kalam
(74) *Attorney, Agent, or Firm* — Innovation Counsel LLP

(57) ABSTRACT

A display device includes a display panel displaying an image to a front surface and a first impact resistance layer disposed on the front surface of the display panel, wherein the first impact resistance layer includes a matrix layer including an internal space and a gel particle filled in the space.

18 Claims, 4 Drawing Sheets

FIG. 3

| | | n-butylacrylate | Bornyl acrylate | 2-phenyl ethylacrylate | 2-hydroxy ethylacrylate | Corss-linker (TDI) | Corss-linker (XDI) |
|---|---|---|---|---|---|---|---|
| Experimental example 1 | Gel particle | 99.9 | | | 0.1 | 0.01 | |
| | Matrix Layer | 87 | 5 | 5 | 3 | | 0.2 |
| Experimental example 2 | Gel particle | 99.9 | | | 0.1 | 0.015 | |
| | Matrix Layer | 87 | 5 | 5 | 3 | | 0.2 |
| Experimental example 3 | Gel particle | 99.9 | | | 0.1 | 0.02 | |
| | Matrix Layer | 87 | 5 | 5 | 3 | | 0.2 |
| Experimental example 4 | Gel particle | 99.9 | | | 0.1 | 0.01 | |
| | Matrix Layer | 87 | 5 | 5 | 3 | | 0.15 |
| Experimental example 5 | Gel particle | 99.9 | | | 0.1 | 0.01 | |
| | Matrix Layer | 72 | 20 | 5 | 3 | | 0.15 |
| Experimental example 6 | Gel particle | 99.9 | | | 0.1 | 0.01 | |
| | Matrix Layer | 82 | 5 | 10 | 3 | | 0.15 |
| Experimental example 7 | Gel particle | 99.9 | | | 0.1 | 0.01 | |
| | Matrix Layer | 87 | 5 | 5 | 3 | | 0.2 |
| Comparative example 1 | Gel particle | 99.9 | | | 0.1 | 0.01 | |
| | Matrix Layer | 77 | 5 | 15 | 3 | | 0.13 |
| Comparative example 2 | Gel particle | 99.9 | | | 0.1 | 0.03 | |
| | Matrix Layer | 87 | 5 | 5 | 3 | | 0.2 |
| Comparative example 3 | Gel particle | 99.9 | | | 0.1 | 0.01 | |
| | Matrix Layer | 87 | 5 | 5 | 3 | | 0.1 |

FIG. 4

| No. | Gel particle Storage Modulus (MPa) | Gel particle Refractive Index | Matrix Layer Storage Modulus (MPa) | Matrix Layer Refractive Index | Impact resistance Layer Layer (μm) | Impact resistance Layer Position | Impact resistance Layer Storage Modulus (MPa) | Impact resistance Layer Haze (%) | Display Moire | Display front surface Ball Drop Test 1 | Display rear surface Ball Drop Test 2 | Display Handling Test 3 |
|---|---|---|---|---|---|---|---|---|---|---|---|---|
| Experimental example 1 | 0.01 | 1.51 | 0.1 | 1.51 | 100 | 1 | 0.06 | 0.8 | ○ N.D. | ○ 15cm | ○ 15cm | OK |
| Experimental example 2 | 0.015 | 1.51 | 0.1 | 1.51 | 100 | 1 | 0.066 | 0.8 | ○ N.D. | ○ 13cm | ○ 15cm | OK |
| Experimental example 3 | 0.018 | 1.51 | 0.1 | 1.51 | 100 | 1 | 0.07 | 0.8 | ○ N.D. | ○ 11cm | ○ 15cm | OK |
| Experimental example 4 | 0.01 | 1.51 | 0.06 | 1.51 | 100 | 1 | 0.04 | 0.8 | ○ N.D. | ○ 17cm | ○ 15cm | OK |
| Experimental example 5 | 0.01 | 1.51 | 0.1 | 1.52 | 100 | 1 | 0.06 | 5.4 | ○ N.D. | ○ 15cm | ○ 15cm | OK |
| Experimental example 6 | 0.01 | 1.51 | 0.1 | 1.53 | 100 | 1 | 0.06 | 19 | ○ N.D. | ○ 15cm | ○ 15cm | OK |
| Experimental example 7 | 0.01 | 1.51 | 0.1 | 1.51 | 100 | 2 | 0.06 | 0.8 | ○ N.D. | △ 11cm | ○ 15cm | OK |
| Comparative example 1 | 0.01 | 1.51 | 0.1 | 1.54 | 100 | 1 | 0.06 | 25 | × (Moire) | ○ 15cm | ○ 15cm | OK |
| Comparative example 2 | 0.025 | 1.51 | 0.1 | 1.51 | 100 | 1 | 0.08 | 0.8 | ○ N.D. | × 6cm | ○ 15cm | OK |
| Comparative example 3 | 0.01 | 1.51 | 0.04 | 1.51 | 100 | 1 | 0.035 | 0.8 | ○ N.D. | ○ 18cm | ○ 15cm | NG (Layer omitting) |

DISPLAY DEVICE

CROSS-REFERENCE TO RELATED APPLICATION

This application claims priority to and the benefit of Korean Patent Application No. 10-2017-0181482 filed in the Korean Intellectual Property Office on Dec. 27, 2017, the entire contents of which are incorporated herein by reference.

BACKGROUND (a) Field

The present disclosure relates to a display device.

(b) Description of the Related Art

Types of display devices include an organic light emitting diode (OLED) display, a liquid crystal display (LCD), and a plasma display panel (PDP).

Among them, the organic light emitting diode display includes a display panel including an organic light emitting element.

Recently, a display device with improved impact resistance has been used by attaching a blowing agent including a plurality of internal spaces to the display panel displaying an image in a front surface.

The above information disclosed in this Background section is only for enhancement of understanding of the background of the present inventive concept and therefore it may contain information that does not form the prior art that is already known in this country to a person of ordinary skill in the art.

SUMMARY

An exemplary embodiment provides the display device with improved impact resistance for the front surface of the display panel displaying the image in the front surface.

One aspect provides a display device including: a display panel configured to display an image to a front surface thereof; and a first impact resistance layer positioned on the front surface of the display panel, wherein the first impact resistance layer includes a matrix layer including an internal space and a gel particle filled in the internal space, a storage modulus of the matrix layer is 0.06 MPa to 0.1 MPa, and a storage modulus of the gel particle is 0.01 MPa to 0.018 MPa.

The matrix layer may include 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI).

The gel particle may include 99.9 parts by weight of n-butyl acrylate, 0.1 parts by weight of 2-hydroxy ethyl acrylate, and 0.01 parts by weight to 0.02 parts by weight of toluene diisocyanate (TDI).

A storage modulus of the first impact resistance layer may be 0.04 MPa to 0.07 MPa.

A refractive index difference between the matrix layer and the gel particle may be 0.02 or less.

A refractive index of the matrix layer may be 1.51 to 1.53, and a refractive index of the gel particle may be 1.51.

Haze of the first impact resistance layer may be 0.8% to 19%.

The internal space may include a plurality of internal spaces, the gel particle may include a plurality of gel particles, and the plurality of gel particles may be respectively filled inside the plurality of internal spaces.

A second impact resistance layer positioned on a rear surface of the display panel and including a plurality of internal spaces may be further included.

A protection layer positioned between the display panel and the second impact resistance layer may be further included.

A window positioned on the front surface of the display panel may be further included, and wherein the first impact resistance layer may be positioned between the display panel and the window.

A first optical layer positioned between the first impact resistance layer and the display panel may be further included.

The first impact resistance layer may be in direct contact with the window and the first optical layer.

A second optical layer positioned between the first impact resistance layer and the window may be further included.

The first impact resistance layer may be in direct contact with the display panel and the second optical layer.

The display panel may include: a flexible substrate; a driving unit positioned on the flexible substrate; an organic light emitting element positioned on the driving unit; and an encapsulation layer positioned on the organic light emitting element.

According to an exemplary embodiment, the display device with improved impact resistance for the front surface of the display panel displaying the image is provided.

BRIEF DESCRIPTION OF THE DRAWINGS

FIG. 3 is a table showing numerical values of a composition of materials included in experimental examples and comparative examples.

FIG. 4 is a table showing physical property values and experiment results of experimental examples and comparative examples.

DETAILED DESCRIPTION OF THE EMBODIMENTS

Figure 1:
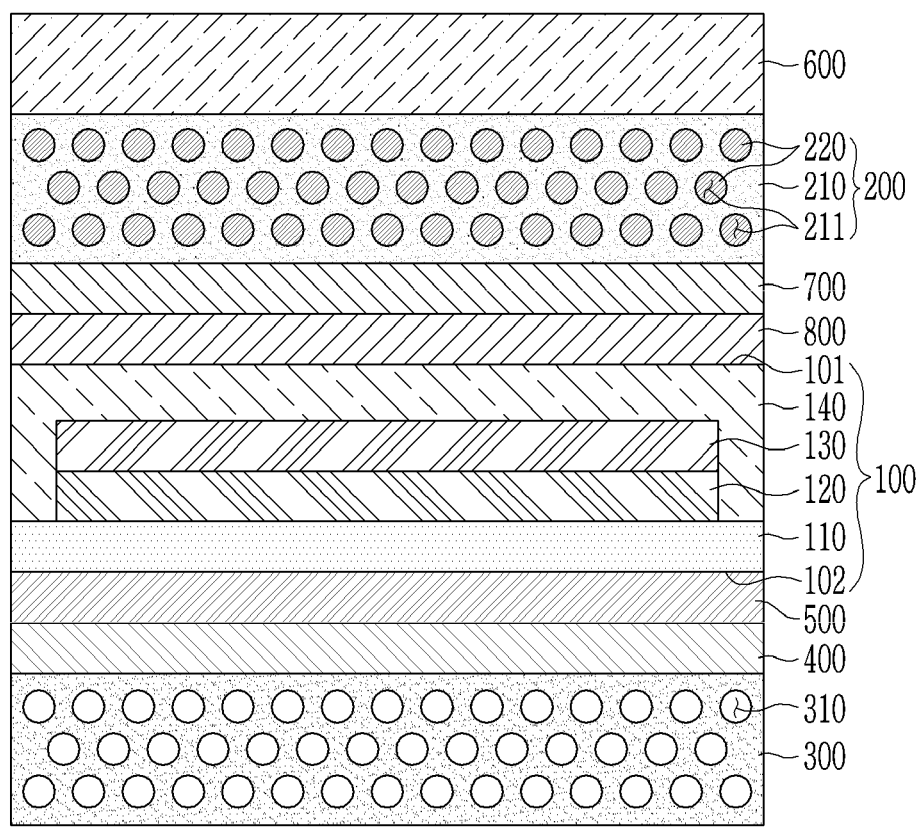
FIG. 1 is a cross-sectional view of a display device according to an exemplary embodiment.

The embodiments will be described more fully hereinafter with reference to the accompanying drawings, in which exemplary embodiments of the present inventive concept are shown. As those skilled in the art would realize, the described embodiments may be modified in various different ways, all without departing from the spirit or scope of the present present inventive concept.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present inventive concept is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Now, a display device according to an exemplary embodiment will be described with reference to FIG. 1.

FIG. 1 is a cross-sectional view of a display device according to an exemplary embodiment.

Referring to FIG. 1, a display device 1000 according to an exemplary embodiment includes a display panel 100, a first impact resistance layer 200, a second impact resistance layer 300, a protection layer 400, a first adhesive layer 500, a window 600, a first optical layer 700, and a second adhesive layer 800.

The display panel 100 includes a flexible substrate 110, a driving unit 120, an organic light emitting element 130, and an encapsulation layer 140.

The flexible substrate 110 includes a polymer such as polyimide, polyethylene, polypropylene, etc.

On the other hand, the display panel 100 according to an exemplary embodiment includes the flexible substrate 110, however the display panel 100 according to another exemplary embodiment may include a rigid substrate includes glass, an organic material, an inorganic material, etc.

The driving unit 120 is positioned on the flexible substrate 110. The driving unit 120 includes a plurality of thin film transistors, at least one capacitor, and a plurality of wires connected to the plurality of thin film transistors and at least one capacitor. The driving unit 120 may have various disclosed structures.

The organic light emitting element 130 is positioned on the driving unit 120.

The organic light emitting element 130 includes a first electrode, a second electrode positioned on the first electrode, and an organic emission layer positioned between the first electrode and the second electrode. The organic light emitting element 130 may have various other disclosed structures.

On the other hand, while in an exemplary embodiment the display panel 100 includes the organic light emitting element 130, the display panel 100 may, in another exemplary embodiment, include a display unit including another means for displaying the image, such as a liquid crystal layer, and the display unit may have various other disclosed structures.

The encapsulation layer 140 is positioned on the organic light emitting element 130. The encapsulation layer 140 encapsulates the driving unit 120 and the organic light emitting element 130 along with the flexible substrate 110. The encapsulation layer 140 includes at least one organic layer and at least one inorganic layer. The organic layer and the inorganic layer may be alternately deposited on the organic light emitting element 130.

On the other hand, while in an exemplary embodiment, the display panel 100 includes the encapsulation layer 140 of a layer type, however the display panel 100 may include an encapsulation substrate of a substrate type in another exemplary embodiment.

The display panel 100 further includes a front surface 101 and a rear surface 102 opposite to the front surface 101, and the display panel 100 displays the image through the front surface 101. The first impact resistance layer 200 is positioned at the front surface 101 of the display panel 100, and the second impact resistance layer 300 is positioned at the rear surface 102.

The first impact resistance layer 200 is positioned on the front surface 101 of the display panel 100. The first impact resistance layer 200 is transparent. The first impact resistance layer 200 is positioned between the display panel 100 and the window 600.

The first impact resistance layer 200 is positioned between the window 600 and the first optical layer 700 and is in direct contact with the window 600 and the first optical layer 700. The first impact resistance layer 200 may adhere between the window 600 and the first optical layer 700, however it is not limited thereto, and adhesive layers may be positioned between the first impact resistance layer 200 and, respectively, the window 600 and the first optical layer 700, in other configurations.

The first impact resistance layer 200 includes a matrix layer 210 and a gel particle 220.

The matrix layer 210 includes a plurality of first spaces 211 therein. The matrix layer 210 may be a blowing agent including a polymer, however it is not limited thereto.

A storage modulus of the matrix layer 210 is 0.06 MPa to 0.1 MPa at room temperature.

Here, room temperature may be −10° C. to 90° C., however it is not limited thereto.

The matrix layer 210 includes 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI).

A refractive index of the matrix layer 210 is 1.51 to 1.53.

A plurality of gel particles 220 are filled in the plurality of first spaces 211 of the matrix layer 210, e.g., each of the plurality of first spaces 211 is filled with at least one of the plurality of gel particles 220. The gel particle 220 includes the polymer of which the storage modulus is smaller compared with that of the matrix layer 210.

The storage modulus of the gel particle 220 is 0.01 MPa to 0.018 MPa at room temperature.

The gel particle 220 includes 99.9 parts by weight of n-butyl acrylate, 0.1 parts by weight of 2-hydroxy ethyl acrylate, and 0.01 parts by weight to 0.02 parts by weight of toluene diisocyanate (TDI).

A difference of the refractive index of the gel particle 220 and the refractive index of the matrix layer 210 is 0.02 or less.

The refractive index of the gel particle 220 is substantially equal to 1.51.

Haze of the first impact resistance layer 200 including the matrix layer 210 and the gel particle 220 that have the above-described small refractive index difference is 0.8% to 19%.

The storage modulus of the first impact resistance layer 200 including the matrix layer 210 and the gel particle 220 having the above-described different storage moduli from each other is 0.04 MPa to 0.07 MPa at room temperature.

The second impact resistance layer 300 is positioned on the rear surface 102 of the display panel 100. The second impact resistance layer 300 is opaque. The second impact resistance layer 300 is positioned at the rear surface of the protection layer 400.

The second impact resistance layer 300 is in direct contact with the protection layer 400. The second impact resistance layer 300 is directly adhered to the protection layer 400, however it is not limited thereto, and an adhesive layer may be positioned between the protection layer 400 and the second impact resistance layer 300.

The second impact resistance layer 300 includes a plurality of second spaces 310 therein. The second impact resistance layer 300 may be the blowing agent including the polymer, however it is not limited thereto.

The protection layer 400 is positioned between the display panel 100 and the second impact resistance layer 300. The protection layer 400 is adhered to the rear surface of the display panel 100, thereby protecting the display panel 100. The protection layer 400 may include the polymer such as polyethylene, polypropylene, etc.

The first adhesive layer 500 is positioned between the display panel 100 and the protection layer 400. The first adhesive layer 500 adheres the display panel 100 and the protection layer 400.

The window 600 is positioned on the front surface 101 of the display panel 100. The window 600 may be adhered to the first optical layer 700 by the first impact resistance layer 200, however it is not limited thereto. The window 600 is in contact with the first impact resistance layer 200.

The first optical layer 700 is positioned between the first impact resistance layer 200 and the display panel 100. The first optical layer 700 may include a linear polarization layer and a phase difference layer. The first optical layer 700 may suppress the reflection of the external light by the display panel 100. The first optical layer 700 may be in direct contact with the first impact resistance layer 200.

The second adhesive layer 800 is positioned between the first optical layer 700 and the display panel 100. The second adhesive layer 800 adheres the first optical layer 700 and the window 600.

As described above, in the display device 1000 according to an exemplary embodiment, because the storage modulus of the matrix layer 210 included in the first impact resistance layer 200 positioned on the front surface 101 of the display panel 100 is 0.06 MPa to 0.1 MPa at room temperature and the storage modulus of the gel particle 220 is 0.01 MPa to 0.018 MPa at room temperature, the impact resistance for the front surface 101 of the display panel 100 is improved and the first impact resistance layer 200 is simultaneously suppressed from being detached from between the display panel 100 and the window 600 even if the display panel 100 is bent due to the bending of the flexible substrate 110.

Also, in the display device 1000 according to an exemplary embodiment, because the difference of the refractive index of the matrix layer 210 and the refractive index of the gel particle 220 which are included in the first impact resistance layer 200 positioned on the front surface 101 of the display panel 100 is 0.02 or less and the haze of the first impact resistance layer 200 is 0.8% to 19%, moiré generated in the image displayed into the front surface 101 of the display panel 100 is suppressed.

As described above, in the display device 1000 according to an exemplary embodiment, as the matrix layer 210 of the first impact resistance layer 200 positioned on the front surface 101 of the display panel 100 includes 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI), and the gel particle 220 includes 99.9 parts by weight of n-butyl acrylate, 0.1 parts by weight of 2-hydroxy ethyl acrylate, and 0.01 parts by weight to 0.02 parts by weight of toluene diisocyanate (TDI), and because the storage modulus of the matrix layer 210 is 0.06 MPa to 0.1 MPa at room temperature, the storage modulus of the gel particle 220 is 0.01 MPa to 0.018 MPa at room temperature, and because the difference of the refractive index of the matrix layer 210 and the refractive index of the gel particle 220 is 0.02 or less, the impact resistance for the front surface 101 of the display panel 100 is improved and the moiré generated in the image displayed into the front surface 101 of the display panel 100 is simultaneously suppressed, and the first impact resistance layer 200 is suppressed from being detached from between the display panel 100 and the window 600.

That is, by providing the first impact resistance layer 200 positioned between the window 600 and the first optical layer 700, the display device 1000 in which the impact resistance for the front surface 101 of the display panel 100 is improved, the moiré generated in the image displayed into the front surface 101 of the display panel 100 is simultaneously suppressed, and the first impact resistance layer 200 is suppressed from being detached from between the display panel 100 and the window 600.

The numerical value range of the composition of the materials included in the matrix layer 210 and the gel particle 220 and the physical property value range of the matrix layer 210 and the gel particle 220 are threshold ranges, and experimental examples and comparative examples confirming them will be described later.

Next, the display device according to another exemplary embodiment will be described with reference to FIG. 2.

In the following, parts other than those from the above-described example embodiment will be described.

Figure 2:
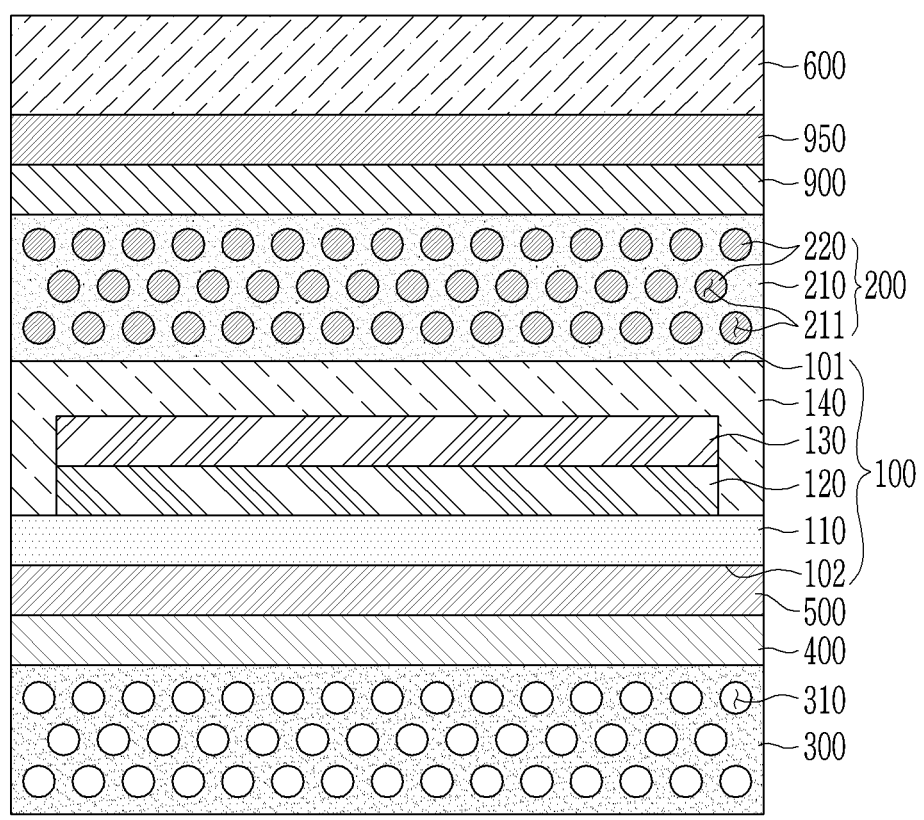
FIG. 2 is a cross-sectional view of a display device according to another exemplary embodiment.

FIG. 2 is a cross-sectional view showing a display device according to another exemplary embodiment.

Referring to FIG. 2, the display device 1000 according to another exemplary embodiment includes the display panel 100, the first impact resistance layer 200, the second impact resistance layer 300, the protection layer 400, the first adhesive layer 500, the window 600, a second optical layer 900, and a third adhesive layer 950.

The first impact resistance layer 200 is positioned between the second optical layer 900 and the display panel 100, and is in direct contact with the second optical layer 900 and the display panel 100. The first impact resistance layer 200 may adhere the second optical layer 900 and the display panel 100, however it is not limited thereto, and an adhesive layer may be positioned between each component.

The first impact resistance layer 200 includes the matrix layer 210 and the gel particle 220.

The second optical layer 900 is positioned between the first impact resistance layer 200 and the window 600. The second optical layer 900 may include the linear polarization layer and the phase difference layer. The second optical layer 900 may suppress the reflection of the external light by the display panel 100. The second optical layer 900 may be in direct contact with the first impact resistance layer 200.

The third adhesive layer 950 is positioned between the second optical layer 900 and the window 600. The third adhesive layer 950 adheres the second optical layer 900 and the window 600.

As above-described, as the first impact resistance layer 200 positioned between the second optical layer 900 and the display panel 100 is included, the display device 1000 in which the impact resistance for the front surface 101 of the display panel 100 is improved, the moiré generated in the image displayed into the front surface 101 of the display panel 100 is simultaneously suppressed, and the first impact resistance layer 200 is suppressed from being detached from between the display panel 100 and the window 600.

Experimental examples and comparative examples confirming that the numerical value range of the composition of the materials included in the matrix layer 210 and the gel particle 220 and the physical property value range of the matrix layer 210 and the gel particle 220 are the threshold range will now be described.

First, the numerical value range of the composition of the materials included in the experimental examples and the comparative examples will be described with reference to FIG. 3.

FIG. 3 is a table showing numerical values of a composition of materials included in experimental examples and comparative examples.

Referring to FIG. 3, in Experimental Example 1 to Experimental Example 7, the matrix layer of the first impact resistance layer includes 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI), and the gel particle includes 99.9 parts by weight of n-butyl acrylate, 0.1 parts by weight of 2-hydroxy ethyl acrylate, and 0.01 parts by weight to 0.02 parts by weight of toluene diisocyanate (TDI).

In Comparative Example 1, in contrast to the numerical value range of the composition of Experimental Example 1 to Experimental Example 7, the matrix layer of the first impact resistance layer includes 15 parts by weight of 2-phenyl ethyl acrylate and 0.13 parts by weight of xylylene diisocyanate (XDI).

In Comparative Example 2, in contrast to the numerical value range of the composition of Experimental Example 1 to Experimental Example 7, the gel particle of the first impact resistance layer includes 0.03 parts by weight of toluene diisocyanate (TDI).

In Comparative Example 3, in contrast to the numerical value range of the composition of Experimental Example 1 to Experimental Example 7, the matrix layer of the first impact resistance layer includes 0.1 parts by weight of xylylene diisocyanate (XDI).

Next, physical property values and experiment results of the experimental examples and the comparative examples will be described with reference to FIG. 4.

FIG. 4 is a table showing physical property values and experiment results of experimental examples and comparative examples.

Referring to FIG. 4, in Experimental Example 1 to Experimental Example 7, the storage modulus of the matrix layer of the first impact resistance layer is 0.06 MPa to 0.1 MPa at room temperature and the refractive index of the matrix layer is 1.51 to 1.53, the storage modulus of the gel particle is 0.01 MPa to 0.018 MPa at room temperature and the refractive index of the gel particle is 1.51, the thickness of the first impact resistance layer is 100 um, the position of the first impact resistance layer is between the window and the first optical layer (1) or between the second optical layer and the display panel (2), the storage modulus of the first impact resistance layer is 0.04 MPa to 0.07 MPa at room temperature, and the haze of the first impact resistance layer is 0.8% to 19%.

In Experimental Example 1 to Experimental Example 7 having the above-described physical property value range according to the above-described numerical value range of the composition, the moiré is not generated on the image displayed into the front surface of the display panel.

In Experimental Example 1 to Experimental Example 7, even if a ball is freely dropped to the front surface of the display panel from a height of 11 cm to 17 cm in a ball drop test (Test 1) for the front surface of the display panel, the display panel is not damaged. In FIG. 4, circles and triangle mean that the display panel is not damaged, and "X" means that the display panel is damaged. That is, the impact resistance of the front surface of the display panel is improved.

Here, the ball drop test (Test 1) may be a test performed by freely dropping a hard ball with a weight of 1 g to the front surface of the display panel from a predetermined height.

In Experimental Example 1 to Experimental Example 7, even if the ball is dropped to the rear surface of the display panel from the height of 15 cm in a ball drop test (Test 2) for the rear surface of the display panel, the display panel is not damaged. That is, the impact resistance for the rear surface of the display panel is improved.

Here, the ball drop test (Test 2) may be a test performed by freely dropping the hard ball with a weight of 1 g to the rear surface of the display panel from a predetermined height.

In Experimental Example 1 to Experimental Example 7, the first impact resistance layer is not detached from the display device in a test (Test 3) when handling the display device.

Here, the test (Test 3) when handling the display device may be a test of repeatedly bending the display device. In Test 3, an intensity of the stress applied to the display device may be of various intensities at which the display device can be bended.

In Comparative Example 1, in contrast to the physical property value range of Experimental Example 1 to Experimental Example 7, the refractive index of the matrix layer of the first impact resistance layer is 1.54, and the haze of the first impact resistance layer is 25%.

In Comparative Example 1, outside the numerical value range of the composition and the physical property value range of Experimental Example 1 to Experimental Example 7, in contrast to Experimental Example 1 to Experimental Example 7, moiré is generated in the image displayed onto the front surface of the display panel.

In Comparative Example 2, in contrast to the physical property value range of Experimental Example 1 to Experimental Example 7, the storage modulus of the gel particle of the first impact resistance layer is 0.025 MPa at room temperature, and the storage modulus of the first impact resistance layer is 0.08 MPa at room temperature.

In Comparative Example 2 outside the numerical value range of the composition and the physical property value range of Experimental Example 1 to Experimental Example 7, the display panel is damaged when the ball is freely dropped to the front surface of the display panel from a height of 6 cm in the ball drop test (Test 1) for the front surface of the display panel. That is, the impact resistance for the front surface of the display panel is deteriorated.

In Comparative Example 3, differently from the physical property value range of Experimental Example 1 to Experimental Example 7, the storage modulus of the matrix layer of the first impact resistance layer is 0.04 MPa at room temperature, and the storage modulus of the first impact resistance layer is 0.035 MPa at room temperature.

In Comparative Example 3 outside the numerical value range of the composition and the physical property value range of Experimental Example 1 to Experimental Example 7, the first impact resistance layer is detached from the display device in the test (Test 3) when handling the display device.

As above-confirmed, in Experimental Example 1 to Experimental Example 7 differently from Comparative Example 1 to Comparative Example 3, as the numerical value range of the composition in which the matrix layer of the first impact resistance layer includes 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI), and the gel particle includes 99.9 parts by weight of n-butyl acrylate, 0.1 parts by weight of 2-hydroxy ethyl acrylate, and 0.01 parts by weight to 0.02 parts by weight of toluene diisocyanate (TDI) is the threshold range, the impact resistance for the front surface of the display panel is improved and simultaneously the moiré is not generated in the image displayed to the front surface of the display panel, and the first impact resistance layer is not detached from the display device.

Also, in Experimental Example 1 to Experimental Example 7, differently from Comparative Example 1 to Comparative Example 3, because the physical property value range in which the storage modulus of the matrix layer of the first impact resistance layer is 0.06 MPa to 0.1 MPa at room temperature and the refractive index of the matrix layer is 1.51 to 1.53, the storage modulus of the gel particle is 0.01 MPa to 0.018 MPa at room temperature and the refractive index of the gel particle is 1.51, and the storage modulus of the first impact resistance layer is 0.04 MPa to 0.07 MPa at room temperature and the haze of the first impact resistance layer is 0.8% to 19% according to the above-described numerical value range of the composition is the threshold range, the impact resistance for the front surface of the display panel is improved and simultaneously the moiré is not generated in the image displayed to the front surface of the display panel, and the first impact resistance layer is not detached from the display device.

While embodiments of this present inventive concept has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. A display device comprising:
   a display panel configured to display an image to a front surface thereof; and
   a first layer disposed on the front surface of the display panel,
   wherein the first layer includes a matrix layer including a polymer layer and an internal space, and a gel particle filled in the internal space, and
   the polymer layer includes 72 parts by weight to 87 parts by weight of n-butyl acrylate, 5 parts by weight to 20 parts by weight of bornyl acrylate, 5 parts by weight to 10 parts by weight of 2-phenyl ethyl acrylate, 3 parts by weight of 2-hydroxy ethyl acrylate, and 0.15 parts by weight to 0.2 parts by weight of xylylene diisocyanate (XDI).

2. The display device of claim 1, wherein
the gel particle includes 99.9 parts by weight of n-butyl acrylate, 0.1 parts by weight of 2-hydroxy ethyl acrylate, and 0.01 parts by weight to 0.02 parts by weight of toluene diisocyanate (TDI).

3. The display device of claim 1, wherein
a storage modulus of the first layer is 0.04 MPa to 0.07 MPa.

4. The display device of claim 1, wherein
a refractive index difference between the matrix layer and the gel particle is 0.02 or less.

5. The display device of claim 4, wherein
a refractive index of the matrix layer is 1.51 to 1.53, and a refractive index of the gel particle is 1.51.

6. The display device of claim 4, wherein
haze of the first layer is 0.8% to 19%.

7. The display device of claim 1, wherein
the internal space includes a plurality of internal spaces, the gel particle includes a plurality of gel particles, and the plurality of gel particles are respectively filled inside the plurality of internal spaces.

8. The display device of claim 1, further comprising
a second layer disposed on a rear surface of the display panel and including a plurality of internal spaces.

9. The display device of claim 8, further comprising
a protection layer disposed between the display panel and the second layer.

10. The display device of claim 8, further comprising
a window disposed on the front surface of the display panel, and
wherein the first layer is disposed between the display panel and the window.

11. The display device of claim 10, further comprising
a first optical layer disposed between the first layer and the display panel.

12. The display device of claim 11, wherein
the first layer is in direct contact with the window and the first optical layer.

13. The display device of claim 10, further comprising
a second optical layer disposed between the first layer and the window.

14. The display device of claim 13, wherein
the first layer is in direct contact with the display panel and the second optical layer.

15. The display device of claim 1, wherein
the display panel includes:
   a flexible substrate;
   a driving unit disposed on the flexible substrate;
   an organic light emitting element disposed on the driving unit; and
   an encapsulation layer disposed on the organic light emitting element.

16. The display device of claim 1, wherein
a storage modulus of the matrix layer is 0.06 MPa to 0.1 MPa.

17. The display device of claim 1, wherein
a storage modulus of the gel particle is 0.01 MPa to 0.018 MPa.

18. The display device of claim 1, wherein
there is no gap between the matrix layer and the gel particle.

* * * * *